United States Patent
Dreibelbis et al.

(10) Patent No.: US 7,472,325 B2
(45) Date of Patent: *Dec. 30, 2008

(54) METHOD FOR SEGMENTING BIST FUNCTIONALITY IN AN EMBEDDED MEMORY ARRAY INTO REMOTE LOWER-SPEED EXECUTABLE INSTRUCTIONS AND LOCAL HIGHER-SPEED EXECUTABLE INSTRUCTIONS

(75) Inventors: Jeffrey H. Dreibelbis, Williston, VT (US); Kevin W. Gorman, Milton, VT (US); Michael R. Nelms, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/062,599

(22) Filed: Apr. 4, 2008

(65) Prior Publication Data

US 2008/0215937 A1 Sep. 4, 2008

Related U.S. Application Data

(63) Continuation of application No. 10/707,971, filed on Jan. 29, 2004, now Pat. No. 7,401,281.

(51) Int. Cl.
*G01R 31/28* (2006.01)
*G11C 29/00* (2006.01)
*G11C 7/00* (2006.01)

(52) U.S. Cl. .................. 714/733; 714/718; 365/201

(58) Field of Classification Search ............ 714/718, 714/733, 201
See application file for complete search history.

(56) References Cited

U.S. PATENT DOCUMENTS

| | | | |
|---|---|---|---|
| 5,614,838 A | 3/1997 | Jaber et al. |
| 5,689,466 A | 11/1997 | Qureshi |
| 5,796,745 A | 8/1998 | Adams et al. |
| 5,805,611 A | 9/1998 | McClure |
| 5,822,228 A | 10/1998 | Irrinki et al. |
| 5,930,814 A | 7/1999 | Lepejian et al. |
| 5,961,634 A | 10/1999 | Tran |
| 6,055,658 A | 4/2000 | Jaber et al. |
| 6,085,346 A | 7/2000 | Lepejian et al. |
| 6,343,366 B1 | 1/2002 | Okitaka |

(Continued)

FOREIGN PATENT DOCUMENTS

DE  100 60 436  5/2000

*Primary Examiner*—Cynthia Britt
(74) *Attorney, Agent, or Firm*—Gibb & Rahman, LLC; Richard M. Kotulak, Esq.

(57) ABSTRACT

Disclosed is a method for segmenting functionality of a hybrid built-in self test (BIST) architecture for embedded memory arrays into remote lower-speed executable instructions and local higher-speed executable instructions. A standalone BIST logic controller operates at a lower frequency and communicates with a plurality of embedded memory arrays using a BIST instruction set. A block of higher-speed test logic is incorporated into each embedded memory array under test and locally processes BIST instructions received from the standalone BIST logic controller at a higher frequency. The higher-speed test logic includes a multiplier for increasing the frequency of the BIST instructions from the lower frequency to the higher frequency. The standalone BIST logic controller enables a plurality of higher-speed test logic structures in a plurality of embedded memory arrays.

13 Claims, 2 Drawing Sheets

U.S. PATENT DOCUMENTS

| | | |
|---|---|---|
| 6,509,766 B1 | 1/2003 | Pomichter et al. |
| 6,510,530 B1 | 1/2003 | Wu et al. |
| 6,550,033 B1 | 4/2003 | Dwork |
| 6,779,144 B2 | 8/2004 | Hayashi et al. |
| 2002/0059543 A1 | 5/2002 | Cheng et al. |
| 2002/0170003 A1 | 11/2002 | Hirabayashi |
| 2002/0171447 A1 | 11/2002 | Ernst et al. |
| 2003/0034791 A1 | 2/2003 | Huang et al. |
| 2004/0085082 A1 | 5/2004 | Townley |
| 2005/0120270 A1 | 6/2005 | Anand et al. |

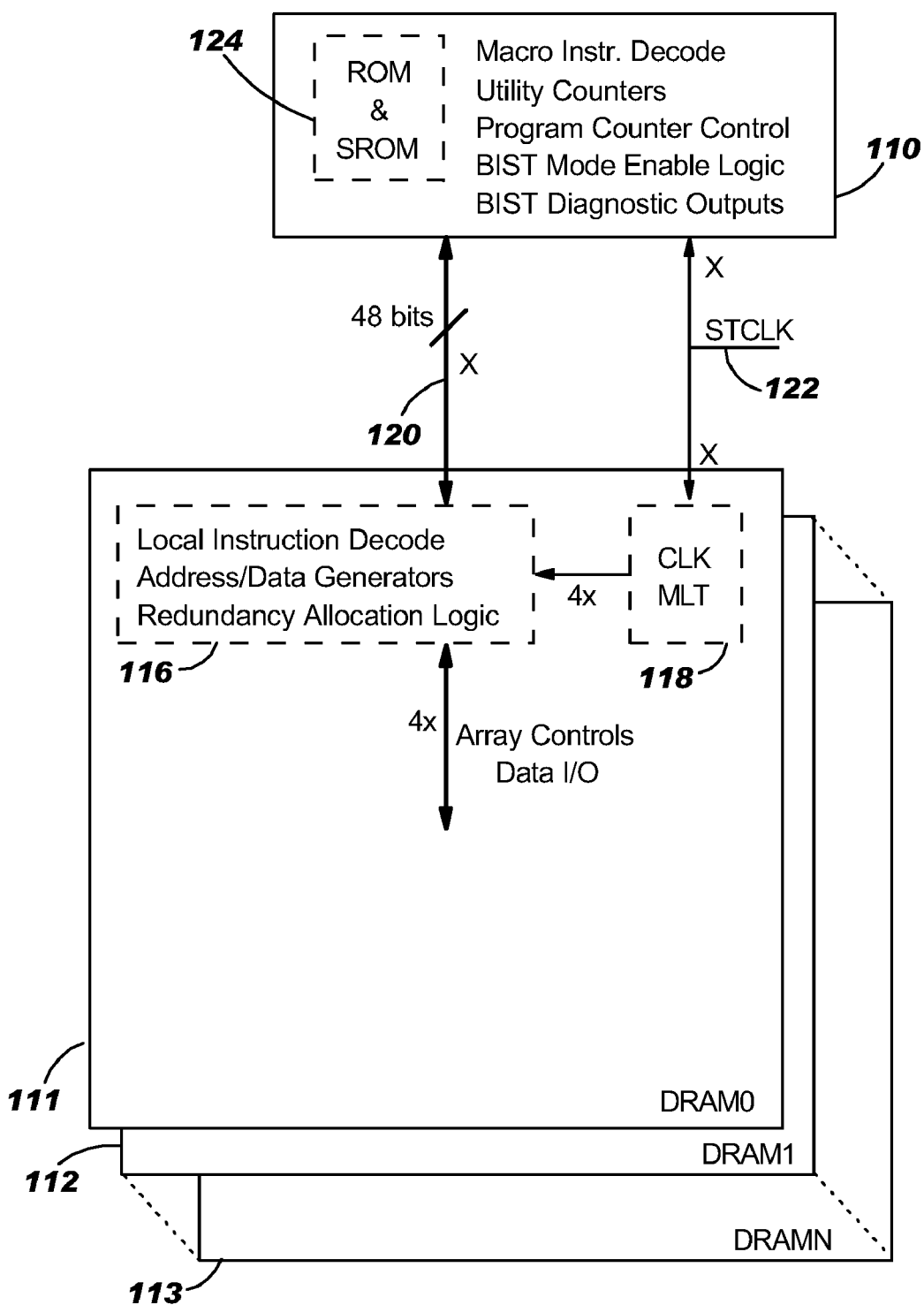

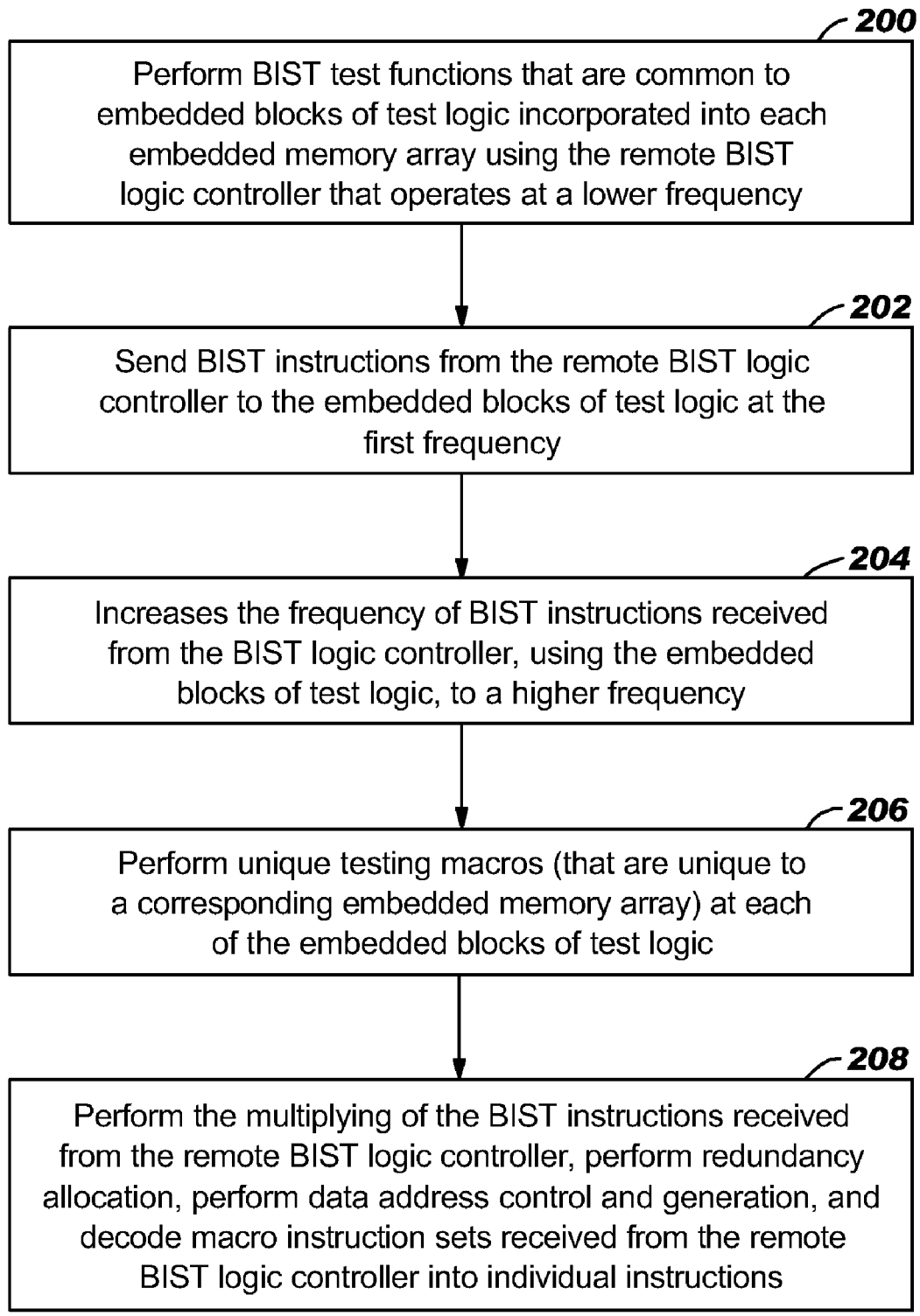

METHOD FOR SEGMENTING BIST FUNCTIONALITY IN AN EMBEDDED MEMORY ARRAY INTO REMOTE LOWER-SPEED EXECUTABLE INSTRUCTIONS AND LOCAL HIGHER-SPEED EXECUTABLE INSTRUCTIONS

CROSS-REFERENCE TO RELATED APPLICATIONS

This application is a continuation of U.S. application Ser. No. 10/707,971 filed Jan. 29, 2004, the complete disclosure of which, in its entirety, is herein incorporated by reference.

BACKGROUND OF THE INVENTION

1. Field of the Invention

The present invention relates to BIST architectures and more particularly, to an architecture for embedded memory arrays that segments BIST functionality into remote lower-speed executable instructions and local higher-speed executable instructions.

2. Description of the Related Art

As embedded memory sizes continue to increase, overall BIST testing time will also increase; hence, novel schemes that reduce testing time while maintaining test integrity and diagnostic resolution are of great value.

In current and future designs, there is a need to separate and distribute memory arrays across a die, placing them near the functional units that they are associated with. To associate a BIST with each memory array would consume a considerable amount of chip real estate. An architecture that provides for a single BIST that could test all the memories without significant extra time for testing would be advantageous given the above stated trend.

As embedded memory performance and complexity continues to increase, BIST testing at application speeds also becomes more important; hence, novel schemes that support increased BIST performance, while still maintaining BIST flexibility and minimizing design schedule and chip real estate impact are of great value. An architecture that allows for a single BIST that can test a diverse range of memory types and sizes at a number of different performance points would be advantageous.

SUMMARY OF THE INVENTION

Disclosed is a method for segmenting functionality of a hybrid built-in self test (BIST) architecture for embedded memory arrays into remote lower-speed executable instructions and local higher-speed executable instructions. A standalone BIST logic controller operates at a lower frequency and communicates with a plurality of embedded memory arrays using a BIST instruction set. A block of higher-speed test logic is incorporated into each embedded memory array under test and this higher-speed test logic locally processes BIST instructions received from the standalone BIST logic controller at a higher frequency. The higher-speed test logic can include a clock multiplier for increasing the processing frequency of the BIST instructions and logic that acts as an instruction multiplier for converting the BIST instructions from the lower frequency to the higher frequency. The standalone BIST logic controller enables a plurality of higher-speed test logic structures in a plurality of embedded memory arrays.

Thus, the invention performs BIST test functions that are common to embedded blocks of test logic incorporated into each embedded memory array using the remote BIST logic controller that operates at a lower frequency. The invention sends BIST instructions from the remote BIST logic controller to the embedded blocks of test logic at the first frequency, and increases the frequency of BIST instructions received from the BIST logic controller, using the embedded blocks of test logic. The invention performs unique testing via the embedded blocks of test logic (that are unique to a corresponding embedded memory array). More specifically, each of the embedded blocks of test logic includes special logic to perform the multiplying of the BIST instructions received from the remote BIST logic controller by decoding macro-instruction sets into multiple individual micro-instructions, perform redundancy allocation, and perform data/address/control generation based upon the decoded multiple individual micro-instructions.

The remote BIST logic controller enables testing of different types of embedded memories. Macro instruction sets are stored in read only memories (ROMs) in the remote BIST logic controller. The remote BIST logic controller provides branch prediction, program counter management, utility counting, and general BIST operation control and diagnostic outputs.

In other words, the invention comprises a built-in self test (BIST) architecture for use with memory arrays embedded in functional circuitry within an integrated circuit. A plurality of embedded blocks of test logic are incorporated into embedded memory arrays, and a remote BIST logic controller is provided separate from the embedded blocks of test logic. A bus connects the remote BIST logic controller to the embedded blocks of test logic. The remote BIST logic controller and the bus operate at a lower frequency than the embedded blocks of test logic.

The remote BIST logic controller performs functions that are common to all of the embedded blocks of test logic including providing branch prediction, program counter management, utility counting, and general BIST operation control and diagnostic outputs. Thus, the remote BIST logic controller comprises logic adapted to provide branch prediction, program counter management, utility counting, general BIST operational control, and diagnostic outputs. To the contrary, the embedded blocks of test logic each include logic for multiplying the frequency of BIST instructions received from the BIST logic controller to a higher frequency that corresponds to the speed at which the embedded memory array operates. Also, each of the embedded blocks of test logic includes unique testing logic blocks that are unique to the corresponding embedded memory array. More specifically, each of the embedded blocks of test logic includes a clock multiplier, redundancy allocation logic, data/address/control generation logic, and decoding logic adapted to decode macro instruction sets received from the remote BIST logic controller into multiple individual micro-instructions.

The remote BIST architecture allows for one BIST to interact with a series of embedded memories through a set of complex macro instructions running at low frequency. Each embedded memory macro has a local block of high speed test logic which produces the high speed micro instructions for correctly stimulating the embedded memory array at high speed. The architecture allows for a simple low speed bus of minimal width to allow communication between the remote BIST and the embedded memory macros. Also, this architecture provides for flexible, high speed testing of multiple embedded memory macros simultaneously.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 1 is a schematic diagram of one embodiment of the invention; and

FIG. 2 is a flow diagram illustrating a preferred method of the invention.

DETAILED DESCRIPTION OF PREFERRED EMBODIMENTS OF THE INVENTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As shown in greater detail below, the invention provides a remote built-in self test device for testing a plurality of embedded memories, whereby the BIST operates at a low frequency and communicates with the multiple DRAMs through a macro instruction set which is then translated to local high speed micro instructions. A local block, embedded in each DRAM, that includes a clock multiplier, data/address/control generation circuitry, and redundancy allocation circuitry that operates at the native (high speed) DRAM frequency, whereby the low frequency macro instructions are further decoded and multiplied and used to directly stimulate the DRAM macro.

Thus, the invention provides an architecture whereby a remote BIST engine enables high-speed testing of multiple potentially different-type embedded memories (DRAM's, SRAM's, CAM's, etc.) via a low speed control bus. For example, FIG. 1 illustrates one non-limiting particular implementation of the remote BIST architecture. One ordinarily skilled in the art would understand that FIG. 1 is merely an example illustrating the invention and that the invention could be implemented in any number of different similar embodiments. Therefore, the invention is not limited to the example that is illustrated in FIG. 1.

In FIG. 1, a single remote BIST master engine 110 is in communication with many embedded blocks of test logic 116 through a bus 120. Each of the embedded memory macros, such as DRAM0-DRAMn (111-113), has a embedded block of test logic 116 and a clock multiplier 118 (that can be separate from the block of test logic 116, as shown in FIG. 1, integrated with the block of test logic 116, or physically remote from the DRAM macros 111-113 and shared among them). Item 122 represent the system clock supplied to BIST logic controller 110 and the embedded blocks of test logic 116 (and/or multiplier 118).

The remote BIST engine 110 runs at slow frequencies (Nx slower than local instruction decode logic/RAL logic 116 contained in each DRAM macro 111-113). In the example shown in FIG. 1, N is 4. The BIST logic controller 110 contains a ROM/SROM 124 for BIST test pattern storage (the SROM is re-loadable with a new test pattern from the off-chip test apparatus and/or the tester). Other memory types may be used for pattern storage. The BIST logic controller 110 also includes the logic necessary for branch prediction/program counter management, utility counting, and logic for handling general BIST operational control and diagnostic outputs. The logic necessary for branch prediction/program counter management controls how the BIST test pattern is executed. The logic actually adjusts the ROM/SROM 124 address pointer based upon the decode of a portion of the BIST test pattern instruction and an examination of all relevant branch conditions (typically related to utility counter states and inputs from other test logic and/or the tester). The logic used for utility counting consists of a number of programmable counters that allow the BIST logic controller 110 to execute an instruction a number of times until the programmed count is obtained. The logic used for general BIST logic controller 110 operational control and diagnostic outputs allows the BIST 110 to interact with the tester and other on-chip test macros. The logic can enable/disable or otherwise pause the BIST logic controller 110 during execution, control bit fail mapping, allow for observation of the current BIST state, reprogram the SROM 124 BIST pattern instructions, and change test modes (or other settings) in the embedded blocks of test logic 116 (and/or the clock multiplier 118 and DRAM macros 111-113). This logic, together with the ROM/SROM 124, is the portion that is common to all DRAM macro testing. Approximately 75% of the logic comprising the BIST test engine 110 would be contained in this remote portion.

The clock multiplier circuit 118 allows the local instruction decode logic to run at the multiplied frequency of x when required, namely, at speed with the DRAM 111-113. The local decode logic 116 includes redundancy allocation logic, data/address/control generation logic, and settings to control decode (for example, settings to decode remote BIST macro commands into N individual micro-instructions that control local address counters and data generators and create array controls at speed).

A portion of the local decode logic 116 uses the locally stored test modes/settings to properly decode and multiply a single macro-instruction from the remote BIST logic controller 110 and produce N individual micro-instructions. A single micro-instruction is decoded in a manner that is modified by the locally stored settings, such that commonly designed local decode logic 116 can produce micro-instructions tailored to a particular embedded memory. The micro-instruction outputs of this portion of the local decode logic 116 in turn control the data/address/control generation portion of the local decode logic 116. The micro-instruction determines the sequence in which the address counter logic increments/decrements to produce addresses, modifies the data pattern logic that generates various data-types, and updates the embedded macro control logic that creates controls (read, write, refresh, match, etc.) for the embedded array. The address/data/controls that are generated are then applied as stimulation to the embedded array under test. The redundancy allocation logic portion of the local decode logic 116 compares expected data with what is currently being read from the embedded memory DRAM 111-113. When stimulations from the data/address/control generation portion of the local decode 116 result in a miscompare or fail between the data and the expected data, the redundancy allocation logic assigns a redundant element to repair the fail. It should be noted that this local decode logic 116 can be modified in software via the local settings or in hardware via physical changes. These changes allow for the local decode logic 116 to suit the memory size and type under test, i.e., the same remote BIST logic controller 110 can control multiple local decode logic blocks 116 that have been modified to appropriately stimulate a particular embedded memory type (DRAM, CAM, SRAM, etc.) size or frequency.

The local portion of the testing logic 116 (not counting the redundancy allocation logic, which can be implemented in a variety of ways independent of the BIST architecture) comprises the remaining 25% of the test logic. Therefore, the invention substantially reduces the amount of BIST circuitry that is included within each of the embedded memories, thereby saving space and substantially increasing BIST speed. One BIST macro command at frequency x, creates N array commands at frequency Nx, or 1 test mode set command at frequency x. Thus, the invention can generate an initial command at a lower frequency that applies multiple operations to multiple addresses at a higher frequency, or can simply send a single command controlling the mode of testing or changing other settings.

The invention is fundamentally different than what occurs conventionally, where the BIST internally generates and decodes one instruction at high speed, and then tests the DRAM according to the decoded single instruction. This invention allows for a separation of the functions whereby the common portion is processed remotely at a low frequency and the portion unique to each macro is processed at the high speed of the DRAM, with one low speed instruction generating multiple high speed DRAM tests. All connections 120 between the remote BIST logic controller 110 and the embedded blocks of test logic 116 operate at low speed, whereas conventional BIST-DRAM connections were forced to run at the desired test speed.

FIG. 2 illustrates the invention in flowchart form; however, the processing steps are not necessarily constrained to the order shown in FIG. 2. Instead, as would be understood by one ordinarily skilled in the art, the processing shown in FIG. 2 could be reordered and/or some of the steps could be performed simultaneously and/or continuously. More particularly, the invention performs BIST test functions that are common to embedded blocks of test logic incorporated into each embedded memory array using the remote BIST logic controller that operates at a lower frequency 200. The invention sends BIST instructions from the remote BIST logic controller to the embedded blocks of test logic at the first frequency 202, and increases the frequency of BIST instructions received from the BIST logic controller, using the embedded blocks of test logic 204. The invention performs unique testing via the embedded blocks of test logic (that are unique to a corresponding embedded memory array) 206. More specifically, each of the embedded blocks of test logic includes special logic to perform the multiplying of the BIST instructions received from the remote BIST logic controller by decoding macro-instruction sets into multiple individual micro-instruction, perform redundancy allocation, and perform data/address/control generation based upon the decoded multiple individual micro-instructions 208.

The remote BIST logic controller 110 enables testing of different types of embedded memories 111-113. Macro instruction sets are stored in read only memories (ROMs) 124 in the remote BIST logic controller 110. The remote BIST logic controller 110 provides branch prediction, program counter management, utility counting, and general BIST operation control and diagnostic outputs.

In other words, the invention comprises a built-in self test (BIST) architecture (e.g., FIG. 1) for use with memory arrays 111-113 embedded in functional circuitry within an integrated circuit (FIG. 1). A plurality of embedded blocks of test logic 116 are incorporated into embedded memory arrays, and a remote BIST logic controller 110 is provided separate from the embedded blocks of test logic 116. A bus 120 connects the remote BIST logic controller 110 to the embedded blocks of test logic 116. The remote BIST logic controller 110 and the bus 120 operate at a lower frequency than the embedded blocks of test logic 116.

The remote BIST logic controller 110 performs functions that are common to all of the embedded blocks of test logic 116 including providing branch prediction, program counter management, utility counting, and general BIST operation control and diagnostic outputs. Thus, the remote BIST logic controller 110 comprises logic adapted to provide branch prediction, program counter management, utility counting, and general BIST operational control and diagnostic outputs. To the contrary, the embedded blocks of test logic 116 each include a multiplier 118 for increasing the frequency of BIST instructions received from the BIST logic controller 110 to a higher frequency of a corresponding embedded memory array 111-113. Also, each of the embedded blocks of test logic 116 includes unique testing logic blocks that are unique to a corresponding embedded memory array. More specifically, each of the embedded blocks of test logic 116 includes a clock multiplier, redundancy allocation logic, data address control generation logic, and decoding logic adapted to decode macro instruction sets received from the remote BIST logic controller 110 into multiple individual micro-instructions.

As shown above, the remote BIST architecture allows for one BIST to interact with a series of DRAMs through a set of complex macro instructions running at low frequency. Each DRAM macro 111-113 has a local block of high speed test logic 116 which produces the high speed micro instructions for correctly stimulating the DRAM array at high speed. The architecture allows for a simple low speed bus of minimal width (e.g., less than 48 bits in this particular implementation) to allow communication between the remote BIST and the DRAM macro 111-113s. Also, this architecture provides for flexible, high speed testing of multiple DRAM macro 111-113s simultaneously.

Most importantly, this single remote BIST block 110 can test a variety of memory types/sizes/frequencies via customization of the local decode logic 116 via hardware or software. Additionally, the single remote BIST block makes up the largest portion of BIST real estate necessary for test of a single macro. The architecture, thus, minimizes the impact of test logic on chip real estate, while still minimizing the communication bus overhead (both in speed and bus width) between the remote BIST block 110 and each macro under test. The architecture also allows for full test flexibility at-speed by combining the ease of use offered by a fully programmable BIST engine with local logic blocks 116 that multiply the instructions produced to the operational frequencies of the memory at test.

Therefore, as shown above, the remote BIST block 110 generates generic memory load/unload commands while the local BIST logic 116 maps these commands to a specific memory architecture (SRAM/DRAM/CAM). The remote BIST is physically separate from the local BIST and is designed to work with many different customized local BISTs to enable testing of many different memory types/sizes/frequencies, etc. in parallel. The multiplication factor of the local BIST can be adjusted by software. The architecture is completely controlled by the actions of the remote BIST, because the local BIST simply decodes and multiplies the instructions supplied by the remote BIST. In addition, the inventive architecture allows for multiple local BIST blocks to run in parallel when performing their uniquely modified decoding processes and multiplications of the generically supplied remote BIST commands.

While the invention has been described in terms of preferred embodiments, those skilled in the art will recognize that the invention can be practiced with modification within the spirit and scope of the appended claims.

What is claimed is:

1. A method of testing embedded memory arrays in functional circuitry within an integrated circuit using a built-in self test (BIST) architecture, said method comprising:
    performing, by a BIST logic controller, test functions common to all of said embedded memory arrays said BIST logic controller being remote from said embedded memory arrays and operating at a lower frequency than said embedded memory arrays;
    sending, by said BIST logic controller, instructions to a plurality of blocks of test logic,
    each one of said blocks being incorporated into a corresponding one of said embedded memory arrays and operating at a same frequency as said corresponding one of said embedded memory array, said same frequency comprising a higher frequency relative to said lower frequency of said BIST logic controller; and
    performing, by said each one of said blocks, test functions unique to said corresponding one of said embedded memory arrays, said performing comprising:
        increasing the frequency of said instructions to said higher frequency.

2. The method in claim 1, all the limitations of which are incorporated herein by reference, said sending comprising using a bus connecting said BIST logic controller to said blocks of test logic so as to allow communication of said instructions from said BIST logic controller to said blocks, wherein said bus operates at said lower frequency of said BIST logic controller.

3. The method in claim 1, all the limitations of which are incorporated herein by reference, said performing, by said each one of said blocks, comprising:
    performing redundancy allocation;
    performing data address control generation; and
    decoding each of said instructions received from said BIST logic controller into individual micro-instructions that are tailored to said corresponding one of said embedded memory arrays.

4. The method in claim 3, all the limitations of which are incorporated herein by reference, said performing of data address control generation and said performing of said redundancy allocation being based on said individual micro-instructions.

5. The method in claim 1, all the limitations of which are incorporated herein by reference, said performing by said BIST logic controller of said test functions common to all of said embedded memory arrays and said performing by said each of said blocks of said test functions unique to said corresponding one of said embedded memory arrays enabling in parallel testing of at least one of the following:
    different types of embedded memories, said different types comprising at least one of a dynamic random access memory (DRAM) array, a static random access memory (SRAM) array, and a content-addressable memory (CAM) array;
    memory arrays operating at different frequencies; and
    different size memory arrays.

6. The method in claim 1, all the limitations of which are incorporated herein by reference, further comprising storing said instructions in one of read only memories (ROMs), a scannable read only memory (SROM), and other type of memory in said BIST logic controller.

7. The method in claim 1, all the limitations of which are incorporated herein by reference, said performing by said BIST logic controller of said test functions common to all of said embedded memory arrays comprising performing:
    branch prediction;
    program counter management;
    utility counting; and
    general BIST operation control and diagnostic outputs.

8. A method of testing embedded memory arrays in functional circuitry within an integrated circuit using a built-in self test (BIST) architecture, said method comprising:
    performing, by a BIST logic controller, test functions common to all of said embedded memory arrays,
    said BIST logic controller being separate from said embedded memory arrays and operating at a lower frequency than said embedded memory arrays;
    sending, by said BIST logic controller, instructions a plurality of blocks of test logic,
    said sending comprising using a bus connecting said BIST logic controller to said blocks of test logic so as to allow communication from said BIST logic controller to said blocks,
    said bus operating at said lower frequency of said BIST logic controller,
    each one of said blocks being incorporated into a corresponding one of said embedded memory arrays and operating at a same frequency as said corresponding one of said embedded memory arrays,
    said same frequency comprising a higher frequency relative to said lower frequency of said BIST logic controller and said bus; and
    performing, by each of said blocks, test functions unique to said corresponding one of said embedded memory arrays, said performing comprising:
        increasing the frequency of said instructions to said higher frequency.

9. The method in claim 8, all the limitations of which are incorporated herein by reference, said performing, by each of said blocks, comprising:
    performing redundancy allocation;
    performing data address control generation; and
    decoding each of said instructions received from said BIST logic controller into individual micro-instructions that are tailored to said corresponding one of said embedded memory arrays.

10. The method in claim 9, all the limitations of which are incorporated herein by reference, said performing of data address control generation and said performing of said redundancy allocation being based on said individual micro-instructions.

11. The method in claim 8, all the limitations of which are incorporated herein by reference, said performing by said BIST logic controller of said test functions common to all of said embedded memory arrays and said performing by said each of said blocks of said test functions unique to said corresponding one of said embedded memory arrays enable in parallel testing of at least one of the following:

different types of embedded memories, said different types comprising at least one of a dynamic random access memory (DRAM) array, a static random access memory (SRAM) array, and a content-addressable memory (CAM) array;

memory arrays operating at different frequencies; and different size memory arrays.

12. The method in claim 8, all the limitations of which are incorporated herein by reference, further comprising storing said instructions in one of read only memories (ROMs), a scannable read only memory (SROM), and other type of memory in said BIST logic controller.

13. The method in claim 8, all the limitations of which are incorporated herein by reference, said performing by said BIST logic controller of said test functions common to all of said embedded memory arrays comprising performing:

branch prediction;

program counter management;

utility counting; and general BIST operation control and diagnostic outputs.

* * * * *